United States Patent [19]

Peiffer

[11] 4,234,626
[45] Nov. 18, 1980

[54] PRODUCING PRINTED CIRCUITS BY CONJOINING METAL POWDER IMAGES

[75] Inventor: Robert W. Peiffer, Jackson, N.J.

[73] Assignee: E. I. Du Pont de Nemours and Company, Wilmington, Del.

[21] Appl. No.: 874,353

[22] Filed: Feb. 1, 1978

[51] Int. Cl.$^3$ .................................................. H01K 1/00
[52] U.S. Cl. ................................... 427/97; 427/96; 427/98; 427/191; 427/192; 427/367; 430/319
[58] Field of Search .............. 427/96, 97, 98, 368, 427/370, 191, 192, 11, 53.1, 367; 29/625; 228/178, 223, 183; 96/362; 430/311, 319

[56] References Cited

U.S. PATENT DOCUMENTS

| | | | |
|---|---|---|---|
| 3,060,024 | 10/1962 | Burg | 96/28 |
| 3,330,695 | 7/1967 | Curran | 427/191 |
| 3,391,455 | 7/1968 | Hirohita | 29/625 |
| 3,506,482 | 4/1970 | Hirohita | 427/96 |
| 3,554,793 | 1/1971 | Kriger | 427/96 |
| 3,593,677 | 7/1971 | McLain | 427/96 |
| 3,637,385 | 1/1972 | Hayes | 96/48 |
| 3,649,268 | 3/1972 | Chu | 96/27 R |
| 3,703,603 | 11/1972 | Levesque | 29/625 |
| 3,781,968 | 1/1974 | Yumagishi | 427/192 |
| 3,859,722 | 1/1975 | Kinsky | 228/223 |
| 4,022,371 | 10/1977 | Skervinko | 228/223 |
| 4,054,479 | 10/1977 | Pieffer | 156/280 |
| 4,054,483 | 10/1977 | Peiffer | 156/632 |

*Primary Examiner*—Ralph S. Kendall

[57] ABSTRACT

By the process of this invention, printed circuits are prepared containing an electrically conductive wiring trace from materials having adherent and non-adherent surface areas, e.g., printed circuit substrates bearing an imaged photoadhesive layer. Onto the adherent surface areas of the material are applied ductile metal or alloy particles, and any excess particles are removed from the non-adherent areas. The metallized areas are conjoined, e.g., with silicon carbide brush or rounded metal rod. The conjoined areas can be electrolessly plated, electroplated or soldered. Multilayer printed circuits can also be prepared by repeating these steps with additional layers of photoadhesive material adhered to underlying printed circuits.

24 Claims, No Drawings

PRODUCING PRINTED CIRCUITS BY CONJOINING METAL POWDER IMAGES

DESCRIPTION

1. Technical Field

This invention relates to a new additive method for preparing printed circuits including multilayer printed circuits, and pertains more particularly to the preparation of printed circuits by conjoining metallized areas.

2. Background Art

Powdered materials such as metal particles have been applied to surfaces having imagewise tacky and non-tacky areas by a number of toning methods to produce printed circuit patterns. Representative methods are disclosed in U.S. Pat. Nos. 3,060,024; 3,391,455; 3,506,482; 3,637,385; 3,649,268; 4,054,479 and 4,054,483. After the metal particles are applied to the tacky image areas and unwanted particles are removed, e.g., mechanically, from the non-tacky image areas, the circuit is formed by one of several additive techniques including fusion of metal particles, electroless plating, electroplating, etc. The printed circuits formed by these additive processes are useful, but the processes have certain disadvantages. For example, they are time consuming, costly, require high temperatures or pH and skillful operators, and are difficult to automate. It is also difficult to prepare certain circuits, particularly smooth circuits having a fine conductive wiring trace. The above disadvantages have been overcome by a process whereby smooth printed circuits containing electrically conductive circuit traces can be produced almost instantly and in an automated procedure without costly and lengthy treatment such as plating and soldering.

DISCLOSURE OF INVENTION

In accordance with this invention, a printed circuit containing an electrically conductive circuit trace is produced from a material having adherent and non-adherent surface areas which comprises applying finely divided ductile metal or alloy particles to the surface areas; removing any excess metal or alloy particles from the non-adherent areas; the improvement comprising conjoining the particulate metallized areas to form an electrically conductive circuit.

The printed circuit substrates employed in the present invention may be any one of the various kinds of synthetic resin plates, synthetic resin laminated plates, or composites, etc., having the necessary electrical and mechanical properties, chemical resistance, heat resistance, etc. Examples of resins include: phenolformaldehyde, epoxy and melamine resins, etc. Glass plates, ceramic or ceramic coated metal plates are also useful. The substrate can also be a paper, cardboard, fiber including glass cloth, wooden sheet material or paper base phenolic resin laminate. Paper base without resin is particularly useful in producing low cost printed circuits. Metal sheets, e.g., with holes, can be used provided that the material adhered thereto acts as a barrier between the metal sheet support and the built-up metallized circuit. Also useful are self-supported photohardenable elements as disclosed in U.S. Pat. No. 4,054,479.

A material that is adherent or tacky or capable of being made adherent by a suitable treatment, e.g., heating or chemical treatment, is applied in the form of a liquid or a solid layer to the surface of the substrate or circuit board. Preferably, adherent image areas should be tacky enough to adhere the metal particles but not too tacky whereby the particles would become engulfed or heavily coated with tacky material. One type of adherent material that is useful is an adhesive which may be painted on the circuit board in the form of the desired electrical circuit. Silk screen printing techniques such as are described in Printed Circuits Handbook, C. F. Coombs, Jr., Editor, McGraw-Hill, Inc., New York, New York, 1967, pages 4-25 to 4-37, are other means of applying adherent materials. Generally, in screen printing an ink is prepared in which suitable printing adaptability is imparted to the adhesive. The adhesive may be an epoxy resin, phenol resin, rubber phenol or polyvinyl butyral and may contain a filler such as a pigment, e.g., carbon, $TiO_2$, zinc oxide, etc. U.S. Pat. Nos. 3,391,455 and 3,506,482 disclose adhesives that have excellent adhesive force, electrical properties and high resistance to heat and chemicals and describe methods of application of the adhesives to circuit boards. Suitable thicknesses for the adhesive ink is 20 to 50 microns.

A preferred type of adherent material is a photoadhesive composition such as a photohardenable, photosoluble, or photodesensitizable composition in liquid form, e.g., solution, suspension, etc., which can be applied to a circuit board by conventional means, e.g., dip coating, spin coating, coating with a doctor knife, spraying, etc. or in the form of a dry layer. For the purposes of this invention a photoadhesive composition is a photosensitive composition which upon imagewise exposure to actinic light will form adherent image areas in either exposed or unexposed image areas either directly or after subsequent treatment of the composition. The photohardenable composition includes photopolymerizable layers capable of addition polymerization, photocrosslinkable layers, and photodimerizable layers. Many specific examples of such photohardenable layers are set forth in the following U.S. patents which are incorporated herein by reference: U.S. Pat. Nos. 3,469,982; 3,526,504; 3,547,730; 3,060,024; 3,622,334; 3,649,268 and French Pat. No. 72 11658. The photosoluble compositions disclosed in U.S. Pat. No. 3,837,860 and the photodesensitizable compositions disclosed in U.S. Pat. No. 3,778,270 are also useful.

A preferred element contains a photohardenable image-yielding stratum on a strippable support. The photohardenable composition is preferably present in a dry coating thickness of about 0.00025 inch (~0.006 mm) to about 0.1 inch (2.54 mm) or more. A removable cover sheet may be present over the photohardenable layer. Photohardenable, e.g., photopolymerizable, layers and elements are more fully described in U.S. Pat. No. 4,054,483, the disclosure of which is incorporated by reference. Photopolymerizable compositions generally contain at least one binder, ethylenically unsaturated monomers, initiators or initiator system, thermal polymerization inhibitors and other additives such as dyes, pigments, plasticizers, etc.

Once a photoadhesive composition or layer is applied to the printed circuit substrate, it is exposed imagewise and either directly forms or can be rendered to form adherent and non-adherent image areas. Suitable radiation sources depend on the photoadhesive composition type. Generally, however, radiation sources that are rich in ultraviolet radiation are useful. Radiation sources are disclosed in U.S. Pat. Nos. 2,760,863 and 3,649,268. The exposure may be through a phototool, negative or positive, having the circuit image including circuit trace.

Ductile metal and alloy particles or combinations thereof are applied to the adherent and non-adherent image areas. Suitable particles include: copper, tin, lead, solder, mixtures of copper and solder, copper-tin alloy, tin-lead alloy, as well as aluminum, gold, silver, etc. The particles have an average diameter of about 1 to 250 microns and preferably 5 to 125 microns. Conductive lines are quite difficult to obtain with average particle sizes less than 5 microns and above 125 microns the particles are so large that they can be easily removed during handling. Mixed particle sizes can be used. A particularly preferred average diameter is 8 to 11 microns. Copper powder is preferred.

The particles can be applied by known methods, including, but not limited to, the toning methods described in the patents listed in the "Background Art" section and U.S. Pat. Nos. 3,391,455 and 3,506,482. Another useful application technique is by use of a fluidized bed of particles, Research Disclosure, June 1977, No. 15882 by Peiffer and Woodruff. It is important that any excess metal or alloy particles be removed from the non-adherent or non-tacky image areas. Suitable mechanical and other means for removing excess particles are described in the above-mentioned U.S. patents and Research Disclosure. Removal may also be accomplished during conjoining.

Although a short heating period is preferred to rapidly improve adhesion of metal particles to the adherent image surfaces, other methods may be used. In some instances, the substrate with the particulate metallized image thereon may simply be held at room temperature for a period of time, e.g., overnight, or pressure may be applied to the particulate image. In other instances, the imaged photoadhesive material may be treated with a volatile solvent or plasticizer for adherent image areas either before, during or after the ductile metal particles are applied. When photo-adhesion is improved by such liquid treatment further curing or hardening steps may not be necessary as exemplified in Example 8 below. Preferably, however, the particulate metallized areas are subsequently hardened or cured by heating, by exposing to actinic radiation, by treating with a suitable hardening or curing catalyst or reagent or other such methods known to those skilled in the art. While the preferred hardening or curing step generally precedes conjoining or burnishing, the hardening or curing reaction in some instances may be combined with and occur concurrently with the conjoining operation. Heating can be carried out by baking, e.g., at about 170° C. or less, or by such radiative heating from infrared or microwave sources. The heating temperature must be below the degradation temperature of the adherent composition. The curing or hardening may be accelerated by prior treatment with a suitable catalyst or reagent which may be present on the metal particles or may be applied independently. When the metallized material or area is photohardenable, it may be hardened by uniform exposure of the metallized element to actinic radiation preferably after a short heating period, e.g., 10 to 100 seconds at about 150° to 180° C., as exemplified in Example 7. The hardening step is dependent on many variables such as the composition used to form the adherent image and its reactivity to heat, light or reagents, the thickness of the applied composition, the mode and conditions of applying hardening energy, etc.

Conjoining the metallized image areas is accomplished by applying shear or pressure to these areas in sufficient amount to modify the metal or alloy particles on the surface to form a circuit. The metal or alloy particles are ductile and can be drawn out, malleated or made smooth, e.g., by burnishing. The shear or pressure should not be excessive, i.e., so great that the metallized areas are damaged or cut thereby breaking the electrical circuit. The conjoining can be accomplished, either automatically or by hand, using, for example, a revolving silicon carbide brush, a hard blunt object, e.g., a rounded metal rod, metal ball, etc. Surprisingly, a smooth metal circuit which has excellent electrical conductivity is provided by the silicon carbide brush and blunt object in a short time period, generally less than one minute. Fine conductive wiring traces can be prepared by the process of this invention.

While not necessary, optional known treatments can be applied to the printed circuit prepared according to the process. The electrically conductive circuit, including circuit trace, can be electrolessly plated, electroplated or soldered. These treatments are known to those skilled in the art and are exemplified in Example 2 below.

BEST MODE FOR CARRYING OUT THE INVENTION

The best mode is illustrated in Example 1 wherein a glass epoxy board is laminated with a photopolymerizable element as described therein and exposed to a source of ultraviolet radiation through a photographic positive circuit pattern. After removal of the support from the photopolymerized surface, the tacky surface is dusted with copper powder, 8 to 11 microns in average diameter. Any excess powder is removed from the non-tacky areas, and the laminate is baked for one hour at 160° to 165° C. A silicon carbide brush is used to burnish the metallized areas thereby conjoining the metal particles to form the conductive printed circuit.

INDUSTRIAL APPLICABILITY

The process of this invention is easily adapted to automation and is applicable to the preparation of fine conductive wiring traces, and low cost printed circuits. The process is also useful in preparing multilayer circuits by using previously prepared printed circuits as the substrate in the process of this invention as described above and/or repeating the operations of the process with additional layers of photoadhesive material adhered to each successive underlying printed circuit and exposing in register with an appropriate phototool for the successive layer. Through-holes can be introduced at appropriate junctures to permit electrical connecting between layers and/or allow insertion of electrical components to be soldered into the finished boards. Through-holes may be introduced into the boards by conventional methods used in fabricating multilayer printed circuits. Stepwise, a procedure for preparing multilayer circuits is as follows:

(1) applying a photoadhesive layer to a previously prepared printed circuit board, (2) exposing the photoadhesive layer to actinic radiation through an appropriate phototool in register with the underlying printed circuit, (3) applying finely divided ductile metal or alloy particles to the adherent image areas, (4) removing any excess metal or alloy particles from the non-adherent image areas, and (5) conjoining the particulate metallized surface to obtain a two-layer multilayer circuit.

Additional circuit layers are added by repeating image (1) through (5) using an appropriate phototool is register with at least one of the underlying printed circuits in each step (2). Similarly double-sided multilayer circuit boards may be produced by carrying out steps (1) through (5) one or more times on each side of a previously prepared double-sided printed circuit board.

If interconnections are desired between two or more of the layers, the conjoined circuit of step (5) above can be further processed as follows:

(6) drilling or punching holes in the desired junction areas of the board;

(7) catalyzing the holes with a conventional solution of tin and palladium chlorides;

(8) cleaning the board to remove the catalyst from the board side surfaces; and (9) electrolessly plating the conductive through-holes with metal to complete the electrical interconnections.

When the photoadhesive material is a photopolymerizable material or other oxygen-sensitive material, the imaging exposure may be carried out in an inert atmosphere, e.g., nitrogen, or the surface of the photoadhesive layer may be laminated with an oxygen-impermeable film cover sheet, e.g., polyester film, or may be coated with a layer that functions as a barrier to oxygen. In the instance when a film or barrier coating is used, the film or coating is removed before application of the finely divided particulate metal particles.

In the preferred process each particulate metallized layer is hardened or cured either before or during the conjoining step (5) as previously described.

The photoadhesive material may be applied by either laminating a film element directly to the previously prepared circuit board or the board may be coated with a solution of the material and dried. Such a laminating procedure may be by a process analogous to Example 4 of U.S. Pat. No. 4,054,483 wherein conjoining of metallized powder images would replace electroless plating.

The coating procedure is also useful in preparing multilayer circuits which are connected by through-holes. The preparation of such multilayer circuits is illustrated by Example 3. Stepwise, such a procedure for preparing multilayer circuits is as follows:

1. holes are drilled or punched in a previously double-sided printed circuit board with or without plated through-holes;

2. the board, including hole walls, is coated with a solution or suspension of photohardenable composition;

3. each board side is laminated with a film cover sheet, e.g., polyester film, or is coated with a solution that functions as a barrier to oxygen;

4. each side of the board is exposed to actinic radiation through an appropriate phototool;

5. each cover sheet or oxygen barrier layer is removed;

6. ductile metal powder, e.g., copper, is applied to the adherent unexposed image areas on both sides of the circuit board as well as to the hole walls;

7. the particulate metallized areas are hardened or cured by heating or uniformly exposing to actinic radiation; and 8. each metallized surface and through-holes are conjoined to obtain a four-level multilayer circuit in which the two outerlayers are interconnected.

The prepared circuits of this invention can be covered with a solder mask composition and preferably a photosensitive flame retardant solder mask film. Subsequently, an adherent image can be made over the solder mask, and a circuit of the image can be made using the process of this invention. In some instances where the solder mask is photosensitive, the solder mask itself may be used to form an adherent image. An adherent image on either side of the prepared circuit may also be used to add visible nomenclature and/or graphics by toning adherent image areas with suitable pigments. Useful toning procedures and elements are described in U.S. Pat. Nos. 3,060,024; 3,620,726 and 3,649,268.

EXAMPLES

The invention will be illustrated by the following examples wherein the parts and percentages are by weight.

EXAMPLE 1

A photopolymerizable composition containing the following ingredients:

| | |
|---|---|
| copolymer of methyl methacrylate (46%), acrylonitrile (9%), butadiene (14%) and styrene (31%) | 1,980 g. |
| trimethylol propane triacrylate | 960 g. |
| benzophenone | 48 g. |
| 4,4'-bis(dimethylamino)-benzophenone | 12 g. |
| methylene chloride | 11,395 g. | is coated on a 0.025 mm thick polyethylene terephthalate support, and the layer is dried to a thickness of about 0.38 to 0.51 mm. The photopolymerizable layer is laminated to a glass-epoxy board (a typical base material used in printed circuit manufacture) and the photopolymerizable layer is exposed for 20 seconds through a photographic positive pattern to ultraviolet radiation of a 400 watt, medium pressure, mercury vapor lamp in a Model DMVL Double Sided Exposure Frame, a product of Colight, Inc. The polyethylene terephthalate support is removed and the photopolymerized surface is dusted with copper powder, 11 microns in average diameter, Alcan MD-183 manufactured by Alcan Metal Powders division Alcan Aluminum Corp., Elizabeth, New Jersey. The excess powder is removed in the exposed non-tacky areas with a water spray leaving a circuit pattern defined by the adherent copper powder. The metallized laminate is baked for one hour at 160°–165° C. and then is conjoined by rubbing or burnishing the metallized areas with a silicon carbide brush (3M Company No. 70S super fine) in a Model SBC-12F circuit board cleaning machine (Somaca ®). Shiny wiring traces of copper are produced which form a conductive printed circuit. The measured resistance at most points is between 0 and 1 ohm cm$^{-1}$.

EXAMPLE 2

Three printed circuits prepared by the conjoining process as described in Example 1 are further treated as follows:

(a) Soldering Treatment

One conjoined printed circuit is brushed with aqueous solder flux, Alpha 709-F manufactured by Alpha Metals, Inc., Jersey City, New Jersey, and then is passed over a solder wave. A highly conductive soldered printed circuit is obtained on the original printed circuit trace. The adhesion of the soldered lines is excellent.

(b) Electroless Plating Treatment

One conjoined printed circuit containing parallel line artwork is dipped for 30 seconds in a 20% by weight solution of sulfuric acid. The sample is placed for 16 hours in an electroless copper plating bath, HiD-410 manufactured by Photocircuits Division, Kollmorgen Corp., Glen Cove, Long Island, New York. The plating on the original printed circuit trace is good. The plated circuit is baked for one hour at 160°–165° C. and the adhesive pad force is measured in an Instron tensile tester Model TTB manufactured by Instron Engineering Corp., Quincy, Massachusetts. The values are 38 g., 28 g., 28 g., 38 g., 30 g., and 33 g. for a 0.023 inch width (0.58 mm) which averages 3.1 lbs./inch (55.36 kg./m.).

(c) Electroplating Treatment

One conjoined printed circuit containing wide parallel line artwork is electroplated in a copper pyrophosphate bath using the following preplate cleaning and bath conditions:

1. Preplate cleaning:

Nutra-Clean ®, a proprietary neutral pH treatment conducted at room temperature for removing copper oxide and organic contaminates, purchased from Shipley Co., Newton, Mass., 30 seconds, water rinse, 20% by weight sulfuric acid, 30 seconds, and water rinse.

2. Copper pyrophosphate bath 8.3 amps for 45 minutes.

The copper-plated printed circuit is baked for one hour at 160° C. The adhesion of the plated lines is very high.

EXAMPLE 3

Printed circuits are prepared on each side of two printed circuit boards as described in Example 1. Holes are drilled in the circuit boards and the boards, including the hole walls, are coated with the following photopolymer solution:

|  | Parts |
| --- | --- |
| copolymer described in Example 1 | 33 |
| trimethylol propane triacrylate | 16 |
| 2-tert-butylanthraquinone | 1 |
| toluene | 77 |
| methylene chloride | 118 |

To each side of the coated circuit boards is laminated a polyethylene terephthalate film, 0.025 mm in thickness. Each side of the circuit boards is exposed for 60 seconds to the ultraviolet radiation source described in Example 1 through a circuit image. The polyethylene terephthalate films are removed and copper powder as described in Example 1 is applied to the unexposed regions on both sides and to the walls of the holes in each board and the excess copper powder is removed. The metallized circuit boards are baked for one hour at 160°–165° C. Using the silicon carbide brush described in Example 1 each side of the circuit boards is conjoined. The holes are conjoined by rotating a round metal rod in the holes. Two four-level multilayer circuits in which the two outer layers are interconnected are obtained.

Holes are drilled in one of the multilayer circuit boards. The holes are catalyzed with a solution of tin and palladium chlorides and the board is washed with water to remove catalyst from both sides of the board. The board is electroless copper plated as described in Example 2(b) to obtain conductive through holes interconnecting the four circuit layers.

EXAMPLE 4

On an insulating base phenolic resin laminate, a circuit trace is printed by a silk-screen printing process using an adhesive composition. The adhesive composition is prepared by adding to 30 g. of epoxy resin consisting of Achmex ® R-11 and 10 g. of Achmex ® H-85, 3 g. of carbon. Copper powder, 8 to 11 microns in average diameter, is dusted onto the layer of the adhesive to completely cover the adhesive print. A pressure of 0.5 to 1.0 t/cm.$^2$ is applied thereon to have copper particles secured to the adhesive. The copper particles not secured to the adhesive are removed, and the adhesive is cured by heating at 150°±10° C. for about one hour. The metallized image is conjoined as described in Example 1. Shiny wiring traces of copper are produced which form a conductive printed circuit.

EXAMPLE 5

The procedure of Example 1 is repeated except that after removal of the polyethylene terephthalate support the photopolymerized surface is dusted with tin powder, 8 microns in average diameter, Alcan MD-301 manufactured by Alcan Metal Powders division of Alcan Aluminum Corp., Elizabeth, New Jersey. The metallized laminate is conjoined with a round stainless steel rod. Shiny wiring traces of tin are produced which form a conductive printed circuit.

EXAMPLE 6

A 7.62 cm × 12.7 cm epoxy coated steel panel is dip coated with the composition of Example 3 and is dried. To each side of the coated board is laminated a polyethylene terephthalate film, 0.025 mm in thickness. Each side of the board is imagewise exposed for 60 seconds as described in Example 1. The polyethylene terephthalate films are removed and each side is dusted with copper powder, rinsed, and baked as described in Example 1, and then, as in that example, the metallized areas are conjoined by rubbing or burnishing with a silicon carbide brush.

EXAMPLE 7

A 0.79 mm piece of sheet steel is cleaned in the circuit board cleaning machine described in Example 1 and, after drying, is laminated at 105° C. with a polyethylene terephthalate film supported photopolymerizable layer, 0.15 mm in thickness, of the following composition:

|  | Parts |
| --- | --- |
| Pentaerythritol triacrylate | 25.0 |
| Di-(2-acryloxyethyl) ether of tetrabromo Bisphenol-A | 10.0 |
| Di-(3-acryloxy-2-hydroxy-propyl) ether of Bisphenol-A | 15.0 |
| Methyl methacrylate(46)/acrylonitrile(9)/butadiene(14)/styrene(31) copolymer | 30.0 |
| Methyl methacrylate(95)/ethyl methacrylate(5) copolymer | 8.0 |
| Michler's ketone | 0.4 |
| Benzophenone | 5.3 |
| Antimony oxide ($Sb_2O_3$) | 6.0 |
| Monastral Green pigment | 0.3 |

The photopolymer layer is exposed for 15 seconds through the support and a photographic positive pattern to ultraviolet radiation using the exposure source of Example 1. The support film is removed and copper powder, as described in Example 5, is applied in a fluidized bed, is heated at ~150° C. for 30 seconds and the excess copper is removed by brushing. The metallized board is passed twice through an ultraviolet exposure source at 3.05 m/min., Model PC-7100 UV Processor, manufactured by Argus International, Hopewell, New Jersey, to harden the photopolymer matrix. The imaged metallized surface is rubbed with a steel ball until the area is shiny. Resistance between unconnected circuit lines and between lines and the steel support is greater than $10^7$ ohms. Resistance of a 5 cm $\times$ 0.02 cm line is less than 500 ohms.

EXAMPLE 8

A photopolymerizable element comprising a 0.01 inch (0.25 mm) thick metal support, an 0.018 inch (0.46 mm) thick cellulosic photopolymerizable layer, and a polyethylene terephthalate cover sheet is prepared, the cellulosic layer having the following composition:

|  | Parts |
| --- | --- |
| Cellulose hydroacetate | 36.0 |
| Cellulose acetate | 9.0 |
| Triethylene glycol diacrylate | 24.1 |
| Succinic anhydride | 13.8 |
| Tributoxyethyl phosphate | 13.0 |
| Glutaric acid | 1.0 |
| 2-ethylanthraquinone | 0.1 |
| Methyl ethyl hydroquinone | 0.18 |
| Diethylcyclohexyl amine | 3.0 |

The element is exposed through the cover sheet to a positive circuit image for 30 seconds by means of the exposure source described in Example 1. The cover sheet is removed, and the exposed element is dipped into ethyl Cellosolve® (2-ethoxy ethanol), and the element is drip drained to remove excess liquid. Copper powder, about 8 microns in average diameter, is applied as described in Example 7, and the excess copper powder is removed by shaking. After setting overnight, excess copper powder is removed by brushing, and the imaged metallized surface is rubbed with a steel ball until the area is shiny. Resistance between unconnected circuit lines and between lines and the steel support is greater than $10^7$ ohms. Resistance of a 0.58 mm by 1.0 cm line is less than 400 ohms.

EXAMPLE 9

Example 1 is repeated except that the photopolymerized surface is dusted first with copper particles, 25 to 76 microns in average diameter, followed by dusting with the 11 microns in average diameter copper powder, and after baking at 160°–165° C. the metallized laminate is washed in dilute $H_2SO_4$ (1% solution) and is passed six times through a rubber mill. The measured resistance at most points is about 0.4 ohm $cm^{-1}$.

I claim:

1. In a process for producing a printed circuit containing an electrically conductive circuit trace from an electrically insulating material having adherent and non-adherent surface areas which comprises applying finely divided ductile metal or alloy particles to the surface areas; removing any excess metal or alloy particles from the non-adherent areas; the improvement comprising applying limited shear or pressure to the adherent ductile metal particles by which the particles are conjoined without damaging the metallized areas to form an electrically conductive circuit.

2. A process according to claim 1 wherein the particulate metallized areas are hardened or cured prior to or during conjoining.

3. A process according to claim 2 wherein the particulate metallized areas are hardened or cured by heating, by exposing to actinic radiation or by treating with a hardening or curing reagent.

4. A process according to claim 1 wherein the particulate metallized areas are heated to less than 180° C. before conjoining.

5. A process according to claim 1 wherein the finely divided, ductile metal or alloy particles have an average diameter of about 1 to about 250 microns.

6. A process according to claim 1 wherein the metal particles are copper or a copper alloy.

7. A process according to claim 1 wherein the adherent and non-adherent surface areas are tacky and non-tacky surface areas, respectively, and are present in an imaged layer of photoadhesive composition.

8. A process according to claim 7 wherein the photoadhesive composition is a photohardenable composition taken from the group consisting of photopolymerizable, photocrosslinkable, and photodimerizable compositions.

9. A process according to claim 1 wherein the electrically conductive circuit trace is electrolessly plated.

10. A process according to claim 1 wherein the electrically conductive circuit trace is electroplated.

11. A process according to claim 1 wherein the electrically conductive circuit trace is soldered.

12. A process according to claim 1 wherein the metallized areas are conjoined with a silicon carbide brush.

13. A process according to claim 1 wherein the metallized areas are conjoined with a rounded metal rod.

14. A process according to claim 1 wherein a multilayer printed circuit element is prepared comprising
    (1) applying a photoadhesive layer to a previously prepared printed circuit board,
    (2) exposing the photoadhesive layer to actinic radiation through an appropriate phototool in register with the underlying printed circuit,
    (3) applying to the adherent image areas finely divided, ductile metal or alloy particles,
    (4) removing any excess metal or alloy particles from the non-adherent image areas, and
    (5) conjoining the particulate metallized surface areas to obtain a two-layer multilayer circuit.

15. A process according to claim 14 wherein multilayer printed circuit elements having three or more circuit layers are prepared by repeating at least once steps (1) through (5) for each additional circuit layer using the multilayer circuit previously prepared in each subsequent step (1) and using the appropriate phototool in register with at least one of the underlying printed circuits in each step (2).

16. A process according to claim 14 wherein holes are drilled or punched in desired junction areas of the conjoined electrically conductive, multilayer circuit printed circuit board; the holes are catalyzed with a colloidal suspension of stannous and palladium chlorides; the circuit board is cleaned to remove excess catalyst from the board side surfaces; and electroless metal plate is applied to obtain electrically conductive through holes interconnecting the multilayered printed circuit.

17. A process according to claim 1 wherein the conjoining is accomplished by burnishing the particulate metallized areas.

18. A process according to claim 17 wherein the burnished areas are soldered.

19. In a process for producing a printed circuit containing an electrically conductive circuit trace from a printed circuit substrate bearing a layer of a photohardened photoadhesive composition having adherent and non-adherent surface areas which comprise applying copper particles, 5 to 125 microns in average diameter, removing excess copper particles from the non-adherent areas, heating the particulate metallized areas; the improvement comprising by means of a silicon carbide brush applying limited shear or pressure to the adherent ductile metal particles by which the particles are conjoined without damaging the metallized areas to form an electrically conductive circuit.

20. A process according to claim 19 wherein the particulate metallized areas are heated to less than 180° C. for less than 100 seconds.

21. A process according to claim 19 wherein the adherent areas containing copper particles are hardened by heating, by exposing to actinic radiation or by treating with a hardening or curing reagent either prior to or during conjoining.

22. A process according to claim 19 wherein the areas are hardened by exposing uniformly to actinic radiation prior to conjoining.

23. A process for making a multilayer printed circuit board according to claim 19 wherein the printed circuit substrate contains thereon a previously prepared printed circuit.

24. A process for forming an electrically conductive multilayer printed circuit from a printed circuit board having an electrically conductive circuit trace present on each side of its printed circuit substrate which comprises drilling holes through the circuit board; applying a photohardenable composition to the surface of the circuit board and hole walls; laminating a cover sheet to each side of the circuit board; exposing each side of the circuit board through an image-bearing transparency to actinic radiation for the photohardenable layer; removing the cover sheets sheets; applying ductile metal or alloy particles, 5 to 250 microns in average diameter, to the exposed surfaces and hole walls; heating the metallized printed circuit, and conjoining the metallized areas and holes to form said electrically conductive multilayer printed circuit.

* * * * *

UNITED STATES PATENT OFFICE
CERTIFICATE OF CORRECTION

PATENT NO. : 4,234,626

DATED : November 18, 1980

INVENTOR(S) : Robert W. Peiffer

It is certified that error appears in the above-identified patent and that said Letters Patent are hereby corrected as shown below:

Claim 24, column 12, lines 8-23 should read:

24. A process for forming an electrically conductive multilayer printed circuit from a printed circuit board having an electrically conductive circuit trace present on each side of its printed circuit substrate which comprises drilling holes through the circuit board; applying a photohardenable composition to the surface of the circuit board and hole walls; laminating a cover sheet to each side of the circuit board; exposing each side of the circuit board through an image-bearing transparency to actinic radiation for the photohardenable layer; removing the cover sheets; applying ductile metal or alloy particles, 5 to 250 microns in average diameter, to the exposed surfaces and hole walls; heating the metallized printed circuit, and [conjoining the metallized areas and holes to form said] applying limited

UNITED STATES PATENT OFFICE
CERTIFICATE OF CORRECTION

PATENT NO. : 4,234,626

DATED : November 18, 1980

INVENTOR(S) : Robert W. Peiffer

It is certified that error appears in the above-identified patent and that said Letters Patent are hereby corrected as shown below:

<u>shear or pressure to the adherent ductile metal particles by which the particles are conjoined without damaging the metallized areas to form an</u> electrically conductive multi-layer printed circuit.

Signed and Sealed this

Twenty-fourth Day of March 1981

[SEAL]

Attest:

RENE D. TEGTMEYER

Attesting Officer     Acting Commissioner of Patents and Trademarks